United States Patent [19]

Kimura et al.

[11] Patent Number: 4,929,469
[45] Date of Patent: May 29, 1990

[54] METHOD OF FORMING A TENTATIVE SURFACE PROTECTIVE COATING

[75] Inventors: Tetsuya Kimura; Toshihiro Fujii; Hiroki Nii, all of Fukuyama, Japan

[73] Assignee: Hayakawa Rubber Co., Ltd., Japan

[21] Appl. No.: 215,564

[22] Filed: Jul. 6, 1988

[51] Int. Cl.⁵ .............................................. B05D 3/06
[52] U.S. Cl. .................................... 427/54.1; 427/98; 427/99; 427/282
[58] Field of Search ................... 427/54.1, 98, 99, 282; 430/5, 262

[56] References Cited

U.S. PATENT DOCUMENTS 4,410,562 10/1983 Nemoto et al. .................... 427/259

OTHER PUBLICATIONS

Drain et al., WO 88/00097, Jan. 14, 1988.

*Primary Examiner*—Stanley Silverman
*Attorney, Agent, or Firm*—Arnold, White & Durkee

[57] ABSTRACT

A splendid tentative surface protective coating which is useful in treating a surface of a substance by soldering or plating and which is peeled off easily from the surface after the treating is formed by preparing a solventless or solvent free type screen ink based on essentially an ultraviolet ray-curable rubbery elastomer, applying a coating of the ink on the surface of the substrate by screen printing or thin film coating, and curing the coating of the ink by irradiation with an ultraviolet ray. The tentative surface protective coating can reproduce exactly a pattern of a mask or screen, have a high chemical resistance and heat resistance, even if it has a thin thickness of 30 μm, and have no afraid of deformation caused by heat curing, whereby a precise and shortened surface treatment of the surface of the substance can be afforded. Also, working environment is improved, and air conditioning equipment can be dispensed with owing to an absence or diminishment of an organic solvent. In addition, according to the present invention, an excellent ink composition is provided which is much suited to screen printing.

7 Claims, No Drawings

METHOD OF FORMING A TENTATIVE SURFACE PROTECTIVE COATING

BACKGROUND OF THE INVENTION

1. Field of the Invention

The present invention relates to a method of forming a tentative surface protective coating cured by irradiation with an ultraviolet ray, an ultraviolet ray-curable rubbery elastomer, and a screen ink using the elastomer. More particularly, the present invention relates to a method of forming a tentative surface protective coating which is used for selectively surface treating a surface of a substance such as, a copper coated integrated plate usable to a printed circuit substrate, a steel plate, an aluminum plate, and a copper plate, a quartz plate, a glass plate, other inorganic substance, and organic substance by means of a surface treating method such as, electrolytic plating, electroless plating, soldering and the like, a rubbery elastomer which is used to the method, and a screen ink using the elastomer.

2. Related Art Statement

Heretofore, as surface treating methods such as, electrolytic plating, electroless plating, and soldering, there have been known the following methods:

① a method wherein a surface of a desired substance to be surface treated having an inorganic surface is placarded with an adhesive tape consisting of a crape paper or a polyester film and an adhesive layer laminated thereon, immersed in a plating liquid or a soldering liquid, subjected to a desired plating or soldering treatment, taken out from the liquid, cooled to ambient temperature, removed from the adhesive tape by peeling, rinsed by a rinsing solvent such as Freon (trade name of a commercial fluorohydrocarbon made by Du Pont Co.) etc., and dried to complete the method;

② a method wherein a surface of a desired substance to be surface treated having an inorganic surface is heated and placarded with a dry film type photoresist material which is used for plating (a commercial product sold by Asahi Chemical Industry Co., Ltd. etc), masked intimately by a nega or posi type photomask, cured by irradiation with an ultraviolet ray, removed from the photomask, developed at the uncured portions by means of a developer such as an alkaline aqueous solution, etc., or an organic solvent, dried by heating or irradiation with an infrared ray, etc., to form a tentative surface protective coating thereon, immersed in a plating or soldering liquid, subjected to a desired plating or soldering treatment, taken out from the liquid, cooled to ambient temperature, removed from the tentative surface protective coating by means of a peeling-off solution determined exclusively for the above dry film type photoresist material, such as an organic solvent, e.g., methylene chloride, trichloroethylene, etc., or a strong alkaline aqueous solution, e.g., a sodium hydroxide aqueous solution, rinsed by water, etc., and dried to complete the method;

③ a method wherein a surface of a desired substance to be surface treated having an inorganic surface is coated with a solution of photoresist material in an organic solvent which is used for plating (a commercial product sold by Tokyo Ouka Kogyo K.K., etc.) by means of a coating machine such as spin coater, houeler, dried by a heating drying machine such as drier to remove the organic solvent, masked intimately by a nega or posi type photomask, cured by irradiation with an ultraviolet ray, removed from the photomask, developed at the uncured portions by means of a developer such as an alkaline aqueous solution, etc., or an organic solvent, dried by heating or irradiation with an infrared ray, etc. to form a tentative surface protective coating, immersed in a plating or soldering liquid, subjected to a desired plating or soldering treatment, taken out from the liquid, cooled to ambient temperature, removed from the tentative surface protective coating by means of a peeling-off solution determined exclusively for the above dry film type photoresist material, such as an organic solvent, e.g., methylene chloride, trichloroethylene, or a strong alkaline aqueous solution, e.g., a sodium hydroxide aqueous solution, rinsed by water, etc., and dried to complete the method; and ④ a method wherein a surface of a desired substance to be surface treated having an inorganic surface is printed with a thermosetting screen printing ink by screen printing, heat treated to form a tentative surface protective coating, immersed in a plating or soldering liquid, subjected to a desired plating or soldering treatment, taken out from the liquid, cooled to ambient temperature, peeled off physically from the tentative surface protective coating to complete the method.

The above described prior methods have many drawbacks as follows.

The prior method ① of placarding the adhesive tape on the inorganic surface of the substance to be surface treated is economical in cost. However, the tape has an inferior chemical resistance to the plating liquid, so that it is frequently peeled off during the plating step, or the tape is melted on the inorganic surface due to the use of the soldering liquid at a high temperature of 250°–260° C., so that, when the adhesive tape is peeled from the inorganic surface, the adhesive agent of the tape is transferred to the inorganic surface to remain thereon, which adhesive agent is very difficult to remove. Moreover, if the areas of the inorganic surface of the substance to be placarded by the adhesive tape exist scatteredly on the inorganic surface, the tape has to be cut to the respective size of the areas and has to be placarded on the areas one by one, so that these procedures are very cumbersome and troublesome.

The prior method ② of heating the inorganic surface and placarding the surface with the dry film type photoresist material has to arrange an exclusive laminating machine for the heating and placarding, and an exclusive developer machine and an exclusive draft chamber for dealing with the developer liquid containing a noxious organic solvent or alkaline aqueous solution. In addition, the developer liquid used for developing the uncured photoresist material has to be substituted after a long use period by a new developer liquid, and the old developer liquid has to be processed and discarded. Moreover, the method is laborsome in that it needs the drying treatment using the heating or infrared ray-irradiation after the developing treatment. Furthermore, the method is laborsome and cumbersome in that it requires the exclusive liquid for peeling off the tentative surface protective coating from the inorganic surface after the plating or soldering treatment.

The prior method ③ of coating the inorganic surface of the substance to be surface treated with the solution of photoresist material in an organic solvent has to arrange an exclusive developer liquid and a ventilation equipment such as a draft chamber, because apparatuses for applying and drying the solution of photoresist material, ventilation equipments such as a draft chamber, and the developer liquid for the developing treatment deal with a noxious organic solvent or an alkaline aqueous solution. In addition, the developer liquid used for developing the uncured photoresist material has to be substituted after a long use period by a new developer liquid, and the old developer liquid has to be processed and discarded. Moreover, the method is laborsome in that it needs the drying treatment using the heating or infrared radiation after the developing treatment. Furthermore, the method is laborsome and cumbersome in that it requires the exclusive liquid for peeling off the tentative surface protective coating from the inorganic surface after the plating or soldering treatment.

The prior method ④ of screen printing the inorganic surface of the substance to be surface treated with the thermosetting screen printing ink can obviate the above drawbacks of prior methods ①-③, because the tentative surface protective coating is formed by screen printing and heat treatment so that both the cumbersome developing treatment and the expensive equipment necessary for the developing treatment can be dispensed with, and the tentative surface protective coating can be easily peeled off manually by hands. However, if a substrate of a laminar structure made of a thin copper layer and a paper layer impregnated with a phenolic resin or a glass layer impregnated with an epoxy resin tightly adhered to each other by an adhesive is used as a printed circuit substrate, the substrate is deformed due to differences of thermal expansion coefficients of the layers at the time of heat curing the screen printed ink, so that the plating or soldering treatment of the screen printed substrate is adversely influenced and difficult to be achieved with good precision. Moreover, the method has a drawback of necessitating a little long curing time of at least 5-10 min. in case of heat curing.

SUMMARY OF THE INVENTION

Therefore, an object of the present invention is to obviate the aforementioned drawbacks of the prior arts.

The inventors have made many studies and experiments leading to the present invention, wherein ① a solventless or solvent free type screen ink based on a rubbery elastomer of an ultraviolet ray-curable type is produced, ② a surface of a substance to be surface treated is coated with the ink by a screen printing machine or a thin film coater, and ③ the ink is cured by irradiation with an ultraviolet ray thereby to form a tentative surface protective coating.

Thus, the present invention is a method of forming a tentative surface protective coating which is used at the time of selectively surface treating a surface of a substance by means of a surface treating method of electrolytic plating, electroless plating or soldering, comprising, producing a solventless or solvent free type screen ink having a screen printing property based on essentially a rubbery elastomer having an ultraviolet ray-curable property, screen printing or coating an organic or inorganic surface of the substance to be surface treated with the ink, and curing the ink by irradiation with an ultraviolet ray thereby forming the tentative surface protective coating.

Preferably, the rubbery elastomer is produced by polymerizing the following four components of 100 parts by weight of a liquidus dienic rubber having at least one or more hydroxyl group and a M.W. of 1,000–10,000, 5–190 parts by weight of a diisocyanate compound, 1–90 parts by weight of dihydric alcohol having a M.W. of not over than 300, and 2–25 parts by weight of ethylenically unsaturated monomer having at least one or more hydroxyl group.

Preferably, the main component of the rubbery elastomer is a rubbery urethaneacrylate having the following structural formula:

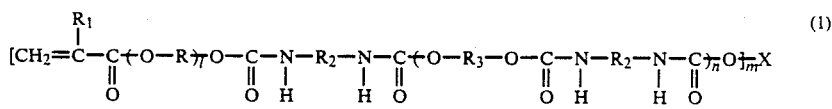

wherein R is an alkylene group having 2-8 carbon atoms, $R_1$ is H or $CH_3$, $R_2$ is a residue of diisocyanate, $R_3$ is a residue of dihydric alcohol from which one or two hydroxyl group is removed, X is a liquidus dienic rubber having at least one or more hydroxyl group from which at least one or more hydroxyl group is removed, l is an integer of 1–4, n is an integer of 1–12, and m is a number of $1 < m < 3$.

The present invention provides also an ink composition comprising, 100 parts by weight of the ultraviolet ray-curable rubbery elastomer as an essential component, and at least one or more of 10–200 parts by weight of an ethylenically unsaturated monomer, 0.1–10 parts by weight of a photosensitizer, 0.01–10 parts by weight of a thermopolymerization inhibitor, 0.001–10 parts by weight of a coloring matter, 0.1–10 parts by weight of a defoamer, 0.5–200 parts by weight of thickening agent or thickener, 0.1–10 parts by weight of a peeling aid, 5–20 parts by weight of a general rubber, 5–20 parts by weight of a liquid rubber, and 5–20 parts by weight of an organic solvent.

The ultraviolet ray-curable rubbery elastomer used in the present invention is the rubbery urethaneacrylate having the formula (1), or it may be selected from polyether series urethaneacrylates and polyester series urethaneacrylates having a flexibility of the coating after the curing by irradiation with an ultraviolet ray and a pencil hardness of B-6B.

The tentative surface protective coating according to the present invention is a far thinner film than conventional coatings. Despite of such thin thickness, the protective coating according to the present invention can exhibit a superior chemical resistance to the plating liquid, an excellent heat resistance to the soldering, and a splendid peeling-off property after the plating or soldering, so that the present invention can diminish extensively the drawbacks of the prior methods by using the protective coating according to the present invention. Moreover, according to the present invention, safety and workability of the prior methods are improved, vainness in the production processes can be dispensed with, and both the process steps and cost are largely decreased. Furthermore, the present invention can provide a surface treating method which can reproduce exactly a pattern of the mask or screen, etc. by the screen printing and which can produce a heat resistant and chemical resistant tentative surface protective coating even if the coating has a much small thickness of 30 μm, which tentative coating can easily be handled in the plating or soldering treatment and peeled off after the plating or soldering treatment. Moreover, the present method can perform a precise surface treatment by the irradiation with an ultraviolet ray for a few seconds up to several tens seconds, namely, about a half of prior methods, without an afraid of deformation, deterioration, etc. of the surface treated substance caused by the heat curing.

Illustrative examples of the liquidus dienic rubber having hydroxyl groups are isoprene, acrylonitrile-butadiene copolymer, styrene-butadiene copolymer, 1,2-polypentadiene, 1,4-polybutadiene, 1,2-polybutadiene, and the like having one or more hydroxyl group at an arbitrary position or positions in the molecule and an average molecular weight of about 1,000–10,000 and the valence m of the hydroxyl group in the molecule is about $1 < m < 3$.

Illustrative examples of the ethylenically unsaturated monomer having one or more hydroxyl group are 2-hydroxy ethylacrylate, 2-hydroxy ethylmethacrylate, 2-hydroxy propylacrylate, 2-hydroxy propylmethacrylate, polypropylene glycol monomethacrylate, and the like.

Illustrative examples of the diisocyanate compound are tolylenediisocyanate, xylylenediisocyanate, naphthalenediisocyanate, hexamethylenediisocyanate, isophorondiisocyanate, 4,4'-diphenylmethanediisocyanate, lysinediisocyanate, hydrated tolylenediisocyanate, and the like.

Illustrative examples of the dihydric alcohol having a M.W. of not over than 300 are ethyleneglycol, diethyleneglycol, triethyleneglycol, 1,2-propyleneglycol, 1,3-propyleneglycol, 1,3-butanediol, 1,4-butanediol, 1,5-pentanediol, 1,6-hexanediol, trimethylolpropanemonoacrylate, trimethylolpropane- monomethacrylate, glycerol-monoalkylether, and the like.

Preferably, the isocyanate compound and the dihydric alcohol having a M.W. of not over 300 are respectively added at amounts of 5–190 parts by weight and 1–90 parts by weight relative to 100 parts by weight of the liquidus dienic rubber having one or more hydroxyl group and a M.W. of 1,000–10,000. If the sum of the amounts of the two components exceeds 280 parts by weight relative to 100 parts by weight of the liquidus dienic rubber, the characteristic properties of the ultraviolet ray-curable rubbery elastomer or copolymer, such as, chemical resistance, water resistance, flexibility, elasticity, elongation, restoring after bending, are damaged, resistances to plating or soldering (chemical resistance and water resistance to plating, heat resistance to soldering) are decreased, and the peeling-off property is deteriorated. While, if the sum of the amounts of the two components is lower than 6 parts by weight relative to 100 parts by weight of the liquidus dienic rubber, microphases separation between hard segments and soft segments of the rubbery elastomer does not proceed well, so that the ultraviolet ray-cured copolymer of high strength and high elongation can hardly be obtained, resulting in poor peeling-off property of the cured copolymer. "Poor peeling-off property" herein means a problem of weak strength of the coating that causes severance of the coating in case of peeling off the coating from the surface-treated surface.

The portion of the repeating unit n of the urethane bondage in the above formula (1) represents the hard segment, and the portion X of the formula (1) represents the soft segment corresponding to the main chain of the rubbery elastomer. The rubbery elastomer of the formula (1) is composed of such two segments, the soft segment exhibiting the soft properties such as flexibility, bend-withstanding, and the like property of the rubbery copolymer, and the hard segment exhibiting rigid properties such as strength, tenacity, tear strength, and the like property of the rubbery copolymer. Thus, the rubbery elastomer according to the present invention has an incorporated hard segment, so that it has an improved adhering property to the substance surface without an afraid of it being peeled off from the substance surface during the plating step.

Preferably, the ethylenically unsaturated monomer having one or more hydroxyl group is added at an amount of 2–25 parts by weight relative to 100 parts by weight of the liquidus dienic rubber having one or more hydroxyl group. If the amount of the ethylenically unsaturated monomer exceeds 25 parts by weight, unreacted components and polymers different from the polymer of the formula (1) are formed in the polymerization step, so that the yield and the shelve stability of the polymer of the formula (1) become worse and physically undesirable polymers are produced. In such case, only a limited amount of the ethylenically unsaturated monomer having one or more hydroxyl group contributes to the addition polymerization, and the remainder of the unsaturated monomer remains as an undesirable unreacted component. While, if the amount of the ethylenically unsaturated monomer is less than 2 parts by weight, unreacted components and polymers different from the polymer of the formula (1) are formed in the polymerization step, so that the yield and the shelve stability of the polymer of the formula (1) become worse and physically undesirable polymers of low photosensitivity in case of the addition polymerization are produced. As described above, the polymerization of the components is restricted by M.W. and number of reacting groups of each component, and the amounts of the main components are limited by the formula (1). These relations are listed in the following Table 1.

TABLE 1

| | Number of reacting group | M. W. |
|---|---|---|
| Dienic liquidus rubber having at least one or more hydroxyl group | $1 < m < 3$ | 1,000–10,000 |
| Diisocyanate compound | 2 | 126–500 (Commercially sold) |
| Dihydric alcohol of a M. W. of ≦ 300 | 2 | 62–300 Commercially sold) |
| Ethylenically unsaturated monomer having a hydroxyl group | 1 | 102–214 |

The ultraviolet ray-curable rubbery elastomer suitable to the use in the method of the present invention is selected from polyether series urethaneacrylates having flexibility and a pencil hardness of B-6B of the coating after cured by irradiation with an ultraviolet ray, polyester series urethaneacrylates having the similar property as that of the polyether series urethaneacrylates, and the mixture thereof.

Illustrative examples of such polyether series urethaneacrylates are those produced by reacting (a) a prepolymer prepared by modifying the both terminals of polyethyleneglycol, polypropyleneglycol, polytetramethyleneglycol, etc. with a diisocyanate compound such as 2,4-tolylenediisocyanate, i.e., a prepolymer having an isocyanate group —NCO at both terminals, and (b) an ethylenically unsaturated monomer having one or more hydroxyl group such as 2-hydroxyethylacrylate, 2-hydroxyethylmethacrylate, 2-hydroxypropylacrylate, or the like, in a mole ratio of 1:2.

Illustrative examples of polyester series urethaneacrylates are those produced by reacting (a) a prepolymer prepared by modifying the both terminals of a polyester made, for example, by polymerizing ethyleneglycol and adipic acid, or a polyester made by polymerizing adipic acid, ethyleneglycol and triethyleneglycol, namely, a prepolymer having an isocyanate group —NCO at both terminals, and (b) the above described ethylenically unsaturated monomer, in a mole ratio of 1:2.

Such polyether series urethaneacrylates are commercially available in the market under the trade names of Aronix M-1100, Aronix M-1200, respectively produced by Toa Gosei Kagaku Kogyo K.K., and Gocerak UV2000B, Gocerak UV3000B, respectively produced by Nippon Gosei Kagaku Kogyo K.K., etc., for example. Such polyester series urethaneacrylates are commercially available in the market under the trade names of PU-122, PU-124, respectively produced by Arakawa Kagaku Kogyo K.K., etc., for example.

"Flexibility and a pencil hardness of B-6B of the coating after cured by irradiation with an ultraviolet ray" hereby means that a cured coating of the above described polyether or polyester series urethaneacrylate added with a photosensitizer, such as benzoin, benzoinmethylether, benzophenone, michlersketone, azobisisobutyronitrile, benzyldimethylkethal, 2-methylanthraquinone, 2,2-diethoxyacetophenone, etc., and irradiated with an ultraviolet ray to cause acryloyl groups or methacrylate groups react sufficiently, has a physical property of a pencil hardness B-6B and a rubber-like state.

Preferably, the screen printable solventless or solvent free type screen ink suitable for the method of the present invention is an ink composition comprising, the above ultraviolet ray-curable rubbery elastomer, the ethylenically unsaturated monomer, and the photosensitizer as essential components, and further comprising at least one of a substance selected from the group consisting of a thermopolymerization inhibitor, a coloring matter, a defoamer, a thickening agent, a peeling aid, a general rubber, a liquid rubber, and some amount of an organic solvent.

As the ethylenically unsaturated monomer for the ink composition, use is made of at least one of the above ethylenically unsaturated monomers having one or more hydroxyl group; methacrylates such as methylmethacrylate, ethylmethacrylate, butylmethacrylate, glycidylmethacrylate, 1,4-butylenedimethacrylate, ethyleneglycoldimethacrylate, and diethylaminoethylmethacrylate; acrylates such as methylacrylate, ethylacrylate, butylacrylate, laurylacrylate, trimethylolpropanediacrylate, trimethylolpropanetriacrylate, neopentylglycoldiacrylate, 1,6-hexanediacrylate, and diethylaminoethylacrylate; methacrylic acid; acrylic acid; acrylonitrile; acrylamide; N-methylolacrylamide, styrene; vinyltoluene; α-methylstyrene; vinylacetate; N-vinyl-2-pyrrolidone; and diallylphthalate, etc. The amount of the ethylenically unsaturated monomer to be added and blended is generally 10–200 parts by weight relative to 100 parts by weight of the ultraviolet ray-curable rubbery elastomer.

As the photosensitizer, use is made of at least one benzoin, benzoinmethylether, benzoinisopropylether, benzoinbutylether, benzophenone, michlersketone, 1-naphthalene-sulfonylchloride, 2,5-naphthalenedisulfonylchloride, 2-naphthalenesulfonylchloride, azobisisobutylnitrile, 1-azobis-1-cyclohexanecarbonitrile, benzyldimethylkethal, 2-methylanthraquinone, biimidazole, thioxantone, 2,4-diisopropylthioxantone, 2,2-diethoxyacetophenone, benzoinperoxide, and 2,4-dichlorobenzoylperoxide, etc. The amount of the photosensitizer to be added and blended is generally 0.1–10 parts by weight relative to 100 parts by weight of the ultraviolet ray-curable rubbery elastomer.

As the thermopolymerization inhibitor, use is made of at least one of hydroquinone, t-butylcathecol, o-dinitrobenzene, o-nitrophenol, m-nitrophenol, p-nitrophenol, 2,4-dinitrirophenol, 2,4,6-trinitrophenol, phenothiazine and ferric chloride, etc. The amount of the thermopolymerization inhibitor to be added and blended is generally 0.01–1.0 parts by weight relative to 100 parts by weight of the ultraviolet ray-curable rubbery elastomer.

As the coloring matter, use is made of at least one of dyes and pigments, generally in an amount of 0.01–1.0 parts by weight relative to 100 parts by weight of the ultraviolet ray-curable rubbery elastomer.

As the defoamer, use is made of at least one of silicone series-, acryl series-, polyglycol series-, and polyether series-surfactants, generally in an amount of 0.1–10 parts by weight relative to 100 parts by weight of the ultraviolet ray-curable rubbery elastomer.

As the thickening agent or viscosity increasing agent, use is made of at least one of inorganic fillers, such as silica, talc, magnesium carbonate, calcium carbonate, titanium oxide, etc. generally in an amount of 0.5–200 parts by weight relative to 100 parts by weight of the ultraviolet ray-curable rubbery elastomer.

As the peeling aid or stripping agent, use is made of at least one of silicone series-, glycol series-, acryl series-, and wax series-peeling aids, etc. generally in an amount of 0.1–10 parts by weight relative to 100 parts by weight of the ultraviolet ray-curable elastomer.

As the general rubber, use is made of at least one of polybutadiene rubber, isoprene rubber, chlorosulfonated polyethylene rubber, natural rubber, and polybutylene rubber, etc. generally in an amount of 5–20 parts by weight relative to 100 parts by weight of the ultraviolet ray-curable elastomer. The general rubber is occasionally added and blended in the ink composition expected to be used in especially severe conditions for improving the chemical resistance and the heat resistance of the cured ink composition. The amount of blending the general rubber is dependent on the screen ink property, and the influence to the ultraviolet ray-curability of the screen ink. If the blending amount of the general rubber exceeds the upper limit of the above blending range, the ultraviolet raycurability of the ink is decreased because the general rubber is a non-photosensing substance. The addition of such excessive amount of general rubber is also not preferable from the viewpoints of public pollution and workability, because the general rubber is added to the ink in a form of a solution in an organic solvent.

As the liquid rubber, use is made of at least one of the above general rubber of liquid type, generally in an amount of 5-50 parts by weight relative to 100 parts by weight of the ultraviolet ray-curable elastomer. Similarly to the general rubber, the liquid rubber is occasionally added and blended in the ink composition expected to be used in especially severe conditions for improving the chemical resistance and the elastic property of the cured ink. The amount of blending the liquid rubber depends on the screen ink property, and the influence to the ultraviolet raycurability of the screen ink, similarly to the case of the general rubber. The influence of the addition of an excessive amount of the liquid rubber is similar to that of the general rubber. However, the liquid rubber is added and blended into the ink without using an organic solvent, so that the problems of public pollution and workability do not occur at all.

If necessary, in case when, for example, adding the general rubber in a form of a solution in an organic solvent to the ink, an organic solvent of an arbitrary type is optionally added to the general rubber for imparting a screen printing property to the ink, generally in an amount of 5-20 parts by weight relative to 100 parts by weight of the ultraviolet ray-curable rubbery elastomer. The amount of the organic solvent is such that the screen printing property and the working environment are not adversely influenced and the screen is not caused to clog by evaporation of the organic solvent, that the curing speed and the curing of the ultraviolet ray-curable rubbery elastomer are not adversely influenced, and that it is usually used depending on its solvent power.

DESCRIPTION OF THE PREFERRED EMBODIMENTS

Hereinafter, the present invention will be explained in more detail with reference to examples, which however, should not be construed by any means as limitations of the present invention.

EXAMPLE 1

(Preparation of the polymerized ultraviolet ray-curable rubbery copolymer)

29.2 g of 2,4-tolylenediisocyanate is dissolved in 87.6 g of dioxane. The solution is charged in a 500 ml capacity reactor, and added with dropwise of 7.5 g of 1,4-butanediol in 22.5 g of dioxane, while agitating in nitrogen atmosphere. During the addition, the reaction temperature is held at 45°-50° C., and the reaction is effected for 3 hrs. at 45°-50° C. after finishing the addition. Thereafter, the solution is added with dropwise of a solution of 10 g of 2-hydroxyethylmethacrylate, 0.15 g of hyroquinone and 0.075 g of triethylenediamine in 33 g of dioxane. During the addition, the reaction solution is held to 75°-80° C., and the reaction is effected for 2 hrs. at 75°-80° C. after finishing the addition. The reaction solution is added dropwise to a solution of 100 g of hydroxyl groups terminated liquidus polybutadiene rubber (average M.W.=2,800, content of hydroxyl groups is 0.83 meg/g, sold in the market under the trade name of "Poly bd R-450" from Idemitsu Petrochemistry K.K.) in 300 g of dioxane in a separate 1,000 ml capacity reactor, while agitating in nitrogen atmosphere. During the addition, the reaction solution is held at 75°-80° C., and reacted at 75°-80° C. for 8 hrs. after finishing the addition. The completion of the reaction is confirmed by disappearance of absorption of isocyanate group in infrared absorption spectrum.

The reaction solution is gradually dropped in 5,400 ml of n-hexane in a beaker, while agitating, to obtain a white precipitate. The precipitate is purified from n-hexane, dried in a vacuum drier for 2 days to obtain a rubbery urethaneacrylate of a solid state. The urethaneacrylate is dissolved in tetrahydrofuran, added with 5% of a photosensitizer commercially available in the market under the trade name of Irgacure 631 produced by Ciba Geigi Co., and the photosensitizer is dissolved to prepare a photosensing solution. The photosensing solution is applied on a glass plate to evaporate tetrahydrofuran to dryness to obtain a dry film of a thickness of 100 μm.

Then, the dry film is exposed to a 3 kW input super high pressure mercury light device produced by K.K. Oak Seisakusho positioned at a distance of 50 cm for 30 seconds, to obtain a cured film. The cured film is tested on a tensile test machine. It has physical properties of a tensile strength of 120 kg/cm$^2$, an elongation of 250%, and a Shore A hardness of 70.

EXAMPLE 2

(Preparation of a solvent free type screen ink having screen printing property based on essentially the ultraviolet ray-curable rubbery elastomer)

Based on the rubbery urethaneacrylate produced by the procedure of Example 1, an ethylenically unsaturated monomer, a photosensitizer and other additives as listed in the following Table 2 are blended in a recipe as shown in Table 2 to prepare an ink A. While, based on a commercial polyether series urethane-acrylate of a trade name of Aronix M-1100, an ethylenically unsaturated monomer, a photosensitizer and other additives as listed in Table 2 are blended in a recipe as shown in Table 2 to prepare and ink B.

TABLE 2

| Component | | Ink A | Ink B (g) |
|---|---|---|---|
| Ultraviolet ray-curable rubbery elastomer | (Rubbery urethaneacrylate of Example 1) | 100 | |
| Ultraviolet ray-curable rubbery elastomer | ($^{(1)}$Polyether series urethaneacrylate) | | 100 |
| Ethylenically unsaturated monomer | (N-vinyl-2-pyrrolidone) | 50 | 80 |
| Ethylenically unsaturated monomer | 1,6-hexanediacrylate) | 100 | 20 |
| Thickener | ($^{(2)}$Aerosil #130) | 10 | 4 |
| Thickener | ($^{(3)}$Mistron vapor talc) | 100 | — |
| Defoamer | ($^{(4)}$Foamaster AP) | 5 | 5 |
| Sensitizer | (Irgacure 651) | 5 | 5 |
| Peeling aid | ($^{(5)}$Separ 404) | 5 | 5 |
| Dye | (Phthalocyanine blue) | 1 | 1 |
| | Sum | 376 | 220 |

Notes:
[1] Aronix M-1100 produced by Toa Gosei Kagaku Kogyo K.K.
[2] Trade name, produced by Nippon Aerosil K.K.
[3] Trade name, produced by Nippon Mistron K.K.
[4] Trade name, produced by Sunnopco K.K.
[5] Trade name, produced by Chukyo Yushi K.K.

Preparation method of ink A is first to dissolve the rubbery urethaneacrylate of Example 1 in N-vinyl-2-pyrrolidone and ethylcarbitolacrylate while agitating, then to add the whole of the above additives to the solution and agitate, and further to pass through an ink roll three times.

Preparation method of ink B is the same as that of ink A, except that Aronix M-1100 is used instead of the rubbery urethaneacrylate of Example 1.

Inks A and B are tested on viscosity and thixotropic index by a BH type viscosimeter produced by K.K. Tokyo Keiki at 25° C. The results are shown in the following Table 3.

TABLE 3

| Test | Ink type | |
|---|---|---|
| | Ink A | Ink B |
| Viscosity (cps) | 300,000 | 300,000 |
| Thixotropy index | 6.5 | 7.2 |

EXAMPLE 3

(Screen printing)

Screen printings are effected using the inks A and B prepared by Example 2. Conditions of the screen printings are a screen of 150 mesh, a screen emulsion thickness of 50 μm, a screen plate of fine lines resolving pattern, an urethane squeeze of a Shore A hardness of 60, a print circuited substrate (as thin plate of glass epoxy-copper having on both sides printed circuits after punching out of throughholes and formation of the circuits by etching), and a manual screen printing. The results of the screen printings are shown in the following Table 4.

TABLE 4

| Property | Ink type | |
|---|---|---|
| | Ink A | Ink B |
| Thickness of printed coating (μm) (Note) | 46 | 50 |
| Defoaming property | Good | Good |
| Levelling property | Good | Good |
| Reproducibility of fine lines | Fairly reproduced a fine line of 500 μm | Fairly reproduced a fine line of 500 μm |

Note:
Measured on the ink screen printed on a glass plate and cured by an ultraviolet ray under the irradiation condition of Example 4. The measurements are effected by means of a micro gauge.

EXAMPLE 4

(Curing by an ultraviolet ray)

The inks A and B screen printed on glass plates by the procedure of Example 3 are cured under the following curing conditions.
Curing condition:
A 3 kW input super high pressure mercury light device "polymer printer" produced by K.K. Oak Seisakusho is used at a distance of 50 cm from the glass plate for an irradiation of 30 seconds.

After curing, both the inks A and B assume a tack-free state, and no defect is seen of a wrinkle caused by uncure of the inks. The pencil hardnesses of the inks A and B are B and 6B, respectively.

EXAMPLE 5

(Plating treatment)

The print circuited substrates (A' and B') having screen printed and ultraviolet ray-cured inks A and B prepared by Example 4 are respectively immersed in an electrolytic plating aqueous solution of AgCN of a hydrogen ion concentration of 14 at 30° C. for 2 hrs. to perform a plating treatment. After the plating, the print circuited substrates are taken out from the plating solution, and rinsed with water. Thus obtained tentative surface protective coatings according to the present invention show no peeling and adhered well to the glass plates. An end of the coating is peeled away from the glass plate by nail, and then pulled away from the glass plate by fingers. The peeled-off coating has a rubber-like elasticity, and was not severed during the peeling-off or pulling-away step.

EXAMPLE 6

(Plating treatment)

The print circuited substrates A' and B' having screen printed and ultraviolet ray-cured inks A and B prepared by Example 4 are respectively immersed in a soldering liquid at 250° C. for 5 seconds. After the immersion, the substrates are taken out from the soldering liquid, and cooled to ambient temperature. Thus obtained tentative surface protective coatings according to the present invention show no peeling and adhered well to the glass plates. An end of the coating is peeled away from the glass plate by nail, and then pulled away from the glass plate by fingers. The peeled-off coating has a rubber-like elasticity, and was not severed during the peeling-off or pulling away step.

As explained in detail in the foregoings, the tentative surface protective coating according to the present invention is formed by preparing a solventless or solvent free type ink of a screen printable characteristic property based on essentially the ultraviolet ray-curable rubbery elastomer, applying a coating of the ink on a surface of an organic or inorganic substance to be coated by screen-printing or a thin film coating, and then irradiating the coating of the ink with an ultraviolet ray to cure the coating of the ink. Therefore, despite of the thin thickness of, e.g., 30 μm, of the surface protective coating, the surface protective coating has superior chemical resistance and heat resistance in case of soldering as well as excellent peeling-off property after a soldering or plating treatment. In forming the tentative surface protective coating the solventless or solvent free type screen ink is used, so that working environment is improved and air conditioning equipment can be dispensed with owing to the absence of an organic solvent. In addition, the tentative surface protective coating is formed by screen printing of the ink and curing of the ink with irradiation of an ultraviolet ray, so that an exact pattern of screen or mask can be reproduced, a precise surface treatment can be afforded, deformation of the surface treated substance and other drawbacks of prior art due to heat curing can be obviated, and curing time can be shortened extensively.

Although the present invention has been explained with specific examples and numeric values, it is of course apparent to those skilled in the art that various changes and modifications thereof are possible without departing the broad spirit and aspect of the present invention as defined in the appended claims.

What is claimed is:

1. A method of forming a temporary surface protective coating on a surface of a substance before treating the surface by any of electrolytic plating, electroless plating, or a soldering treatment, comprising preparing a solventless or solvent free type screen ink essentially based on an ultraviolet ray-curable rubber copolymer obtained by polymerizing 100 parts by weight of a liquidus dienic rubber having at least one hydroxyl group and a M.W. of 1,000–10,000, 5–190 parts by weight of a diisocyanate compound, 1–90 parts by weight of a dihydric alcohol having a M.W. of not more than 300, and 2–25 parts by weight of an ethylenically unsaturated monomer having at least one hydroxyl group; the ultraviolet ray-curable rubber copolymer having a formula:

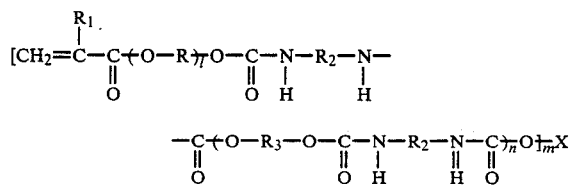

wherein R is an alkylene group having 2–8 carbon atoms, $R_1$ is H or $CH_3$, $R_2$ is a residue of diisocyanate, $R_3$ is a residue of dihydric alcohol from which at least one hydroxyl group is removed, X is a liquidus dienic rubber having one or more hydroxyl groups from which at least one hydroxyl group is removed, l is an integer of 1–4, n is an integer of 1–12, and m is a number of $1 < m < 3$, applying a coating of the ink on the surface of the substance by screen printing or thin film coating, and curing the coating of ink by irradiation with ultraviolet rays to form the temporary surface protective coating.

2. A method as defined in claim 1, wherein the liquidus dienic rubber is isoprene, acrylonitrilebutadiene copolymer, styrene-butadiene copolymer, 1,2-polypentadiene, 1,4-polybutadiene, or 1,2-polybutadiene.

3. A method as defined in claim 1, wherein the ethylenically unsaturated monomer for producing the rubbery copolymer is 2-hydroxy ethylacrylate, 2-hydroxy ethylmethacrylate, 2-hydroxy proplacrylate, 2-hydroxy propylmethacrylate, or polypropylene glycol monomethacrylate.

4. A method as defined in claim 1, wherein the diisocyanate compound is tolylenediisocyanate, xylylenediisocyanate, naphthalenediisocyanate, hexamethylenediisocyanate, isophorondiisocyanate, 4,4'-diphenylmethanediisocyanate, lysinediisocyanate, or hydrated tolylenediisocyanate.

5. A method as defined in claim 1, wherein the dihydric alcohol having a M.W. of not over than 300 is ethyleneglycol, diethyleneglycol, triethyleneglycol, 1,2-propyleneglycol, 1,3-propyleneglycol, 1,3-butanediol, 1,4-butanediol, 1,5-pentanediol, 1,6-hexanediol, trimethylolpropanemonoacrylate, trimethylolpropanemonomethacrylate, or glycerol-α-monoallylether.

6. A method as defined in claim 1, wherein the solventless or solvent free type screen ink is an ink composition comprising, 100 parts by weight of the ultraviolet ray-curable rubbery copolymer of the formula (1) as an essential component, 10–200 parts by weight of an ethylenically unsaturated monomer, and 0.1–10 parts by weight of a photosensitizer, further comprising at least one of 0.01–10 parts by weight of a thermopolymerization inhibitor, 0.001–10 parts by weight of a coloring matter, 0.1–10 parts by weight of a defoamer, 0.5–200 parts by weight of a thickener, 0.1–10 parts by weight of a peeling aid, 5–20 parts by weight of a general rubber, 5–50 parts by weight of a liquid rubber or 5–20 parts by weight of an organic solvent.

7. A method as defined in claim 6, wherein the ethylenically unsaturated monomer for constituting the ink composition is 2-hydroxy ethylacrylate, 2-hydroxy ethylmethacrylate, 2-hydroxy propylacrylate, 2-hydroxy propylmethacrylate, polypropylene glycol monomethacrylate, methylmethacrylate, ethylmethacrylate, butylmethacrylate, glycidylmethacrylate, 1,4-butylenediamethacryalte, ethyleneglycoldimethacrylate, diethylaminoethylmethacrylate, methylacrylate, ethylacrylate, butylacrylate, laurylacrylate, trimethylolpropanediacrylate, trimethylolpropanetriacrylate, neopentylglycoldiacrylate, 1,6-hexanediacrylate, and diethylaminoethylacrylate, methacrylic acid, acrylic acid, acrylonitrile, acryllamide, N-methylolacrylaminde, styrene, vinyltoluene, α-methylstyrene, vinylacetate, N-vinyl-2-pyrrolidone or diallylphthalate.

* * * * *